United States Patent
Wang

(10) Patent No.: US 10,581,014 B2
(45) Date of Patent: Mar. 3, 2020

(54) PACKAGING METHOD OF DISPLAY PANEL, DISPLAY PANEL AND DISPLAY DEVICE

(71) Applicant: BOE TECHNOLOGY GROUP CO., LTD., Beijing (CN)

(72) Inventor: Linlin Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/994,401

(22) Filed: May 31, 2018

(65) Prior Publication Data
US 2019/0036071 A1   Jan. 31, 2019

(30) Foreign Application Priority Data
Jul. 31, 2017   (CN) .......................... 2017 1 0641213

(51) Int. Cl.
*H01L 51/52*   (2006.01)
*C09J 9/00*    (2006.01)
(Continued)

(52) U.S. Cl.
CPC ............ *H01L 51/5246* (2013.01); *C09J 5/00* (2013.01); *C09J 9/00* (2013.01); *C09J 11/04* (2013.01);
(Continued)

(58) Field of Classification Search
CPC ............... H01L 51/5237; H01L 51/524; H01L 51/5243; H01L 51/5246; H01L 2251/305; H01L 2251/306
See application file for complete search history.

(56) References Cited

U.S. PATENT DOCUMENTS

2008/0006352 A1*   1/2008   Koshiba .............. H01F 1/15308
                                                    148/561
2011/0133170 A1*   6/2011   Oh ....................... H01L 51/5246
                                                     257/40
(Continued)

FOREIGN PATENT DOCUMENTS

CN   105957977 A   9/2016
CN   106784360 A   5/2017
CN   106935729 A   7/2017

OTHER PUBLICATIONS

Chinese Office Action in Chinese Application No. 201710641213.6, dated Sep. 4, 2018 with English translation.

*Primary Examiner* — Frederick B Hargrove
(74) *Attorney, Agent, or Firm* — Collard & Roe, P.C.

(57) ABSTRACT

A packaging method of a display panel, a display panel and a display device are provided. The packaging method includes: providing a first substrate; providing an adhesive with a magnetic material distributed therein; applying the adhesive to a surface of the first substrate to form a first adhesive layer having a first pattern; providing a magnetic field to drive the magnetic material to mobilize the adhesive on the surface of the first substrate, so as to transform the first adhesive layer having the first pattern into a second adhesive layer having a second pattern, wherein, an orthogonal projection of the first adhesive layer having the first pattern on the first substrate is different from an orthogonal projection of the second adhesive layer having the second pattern on the first substrate; and bonding a second substrate onto the adhesive layer having the second pattern.

13 Claims, 4 Drawing Sheets

(51) Int. Cl.
*C09J 5/00* (2006.01)
*C09J 11/04* (2006.01)
*H01L 51/56* (2006.01)
*C08K 3/22* (2006.01)
*H01L 27/32* (2006.01)

(52) U.S. Cl.
CPC .. *C08K 2003/2272* (2013.01); *C08K 2201/01* (2013.01); *H01L 27/3241* (2013.01); *H01L 51/56* (2013.01); *H01L 2251/303* (2013.01); *H01L 2251/305* (2013.01)

(56) References Cited

U.S. PATENT DOCUMENTS

| | | | | |
|---|---|---|---|---|
| 2011/0248625 | A1* | 10/2011 | Kwon | H01L 51/524 |
| | | | | 313/504 |
| 2016/0315280 | A1* | 10/2016 | Kizu | H01L 51/5203 |
| 2016/0347977 | A1* | 12/2016 | Ge | C08K 9/04 |
| 2018/0205035 | A1 | 7/2018 | Chen et al. | |
| 2018/0301512 | A1* | 10/2018 | Yu | H01L 27/32 |

\* cited by examiner

PACKAGING METHOD OF DISPLAY PANEL, DISPLAY PANEL AND DISPLAY DEVICE

The present application claims priority of Chinese Patent Application No. 201710641213.6 filed on Jul. 31, 2017, the disclosure of which is incorporated herein by reference in its entirety as part of the present application.

TECHNICAL FIELD

Embodiments of the present disclosure relate to a packaging method of a display panel, a display panel, and a display device.

BACKGROUND

A function of packaging an Organic Light-Emitting Diode (OLED) display panel is blocking water and oxygen, which is implemented by combining a frame sealant with a filling adhesive inside the panel.

SUMMARY

An embodiment of the present disclosure provides a packaging method of a display panel, including: providing a first substrate; providing an adhesive with a magnetic material distributed therein; applying the adhesive to a surface of the first substrate to form a first adhesive layer having a first pattern; providing a magnetic field to drive the magnetic material to mobilize the adhesive on the surface of the first substrate, so as to transform the first adhesive layer having the first pattern into a second adhesive layer having a second pattern, wherein, an orthogonal projection of the first adhesive layer having the first pattern on the first substrate is different from an orthogonal projection of the second adhesive layer having the second pattern on the first substrate; and bonding a second substrate onto the adhesive layer having the second pattern.

In an example, an orthogonal projection of the first adhesive layer having the first pattern on the first substrate is smaller than an orthogonal projection of the second adhesive layer having the second pattern on the first substrate.

In an example, the display panel has a display region, and an orthogonal projection of the second adhesive layer having the second pattern on the first substrate at least partially overlaps with an orthogonal projection of the display region on the first substrate.

In an example, the providing a first substrate includes providing the first substrate to a carrying platform, and the carrying platform is configured to provide the magnetic field.

In an example, the first adhesive layer having the first pattern includes a plurality of separated portions.

In an example, the second adhesive layer having the second pattern is continuous.

In an example, the providing an adhesive doped with a magnetic material includes: mixing the adhesive and the magnetic material in a filling machine; stirring the adhesive and the magnetic material mixed in a defoaming machine, so that the magnetic material is uniformly distributed in the filling adhesive.

In an example, the first substrate includes a glass plate or a package cover plate on which an electroluminescent element is formed.

In an example, the magnetic material is transparent.

In an example, as to the first adhesive layer having the first pattern, a distance between each adjacent two separated portions is in a range of 8 mm to 12 mm, and a mass of each of the separated portions is in a range of 0.5 mg to 1.0 mg.

Another embodiment of the present disclosure provides a display panel, including: a first substrate, a second substrate and an adhesive layer located between the first substrate and the second substrate, wherein, a magnetic material is distributed in the adhesive layer.

In an example, the display panel has a display region, and an orthogonal projection of the adhesive layer on the first substrate at least partially overlaps with an orthogonal projection of the display region on the first substrate.

In an example, the display panel is an electroluminescent display panel.

In an example, the magnetic material is transparent.

In an example, the magnetic material is nano γ-Fe2O3.

In an example, a distance between the first substrate and the second substrate is in a range of 5 μm to 6 μm.

Yet another embodiment of the present disclosure provides a display device, including the display panel according to claim 11.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

In a packaging mode, a filling adhesive is distributed on glass in dots or in lines. Disadvantages of such packaging mode are: it is difficult to uniformly distribute the respective dots or the respective lines, and it is necessary to strictly control dripping precision and a dripping quantity of the filling adhesive. The filling adhesive has poor natural fluidity, and needs a press-fitting process to diffuse; As a result, a phenomenon of a lattice display unevenness will often occur at a dot-to-dot overlapping position, which affects a lighting effect of a panel.

Figure 1:
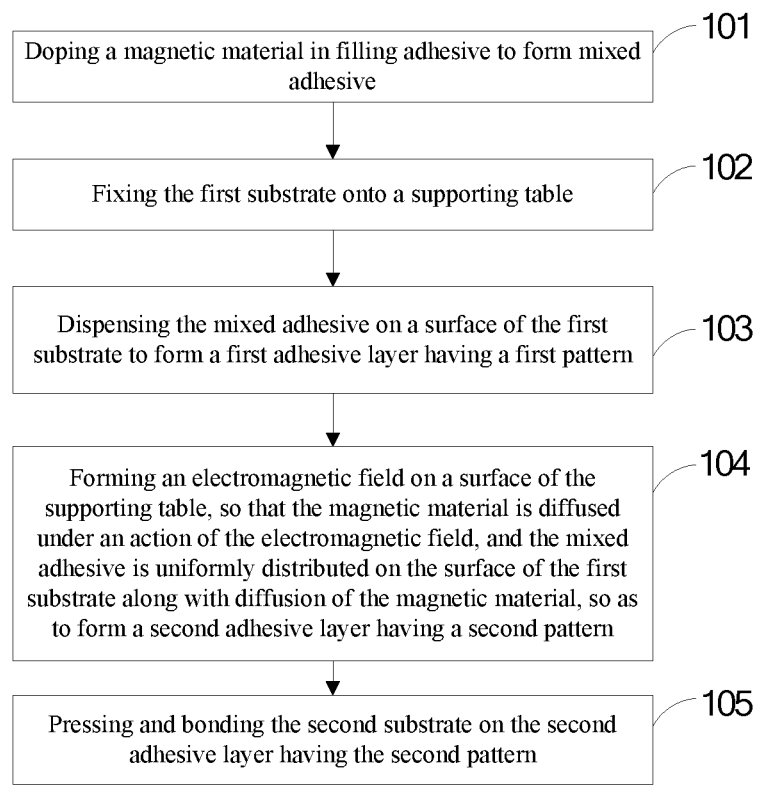
FIG. 1 shows a flow chart of steps of a packaging method of a display panel according to an embodiment of the present disclosure.

FIG. 1 shows a flow chart of steps of a packaging method of a display panel provided by an embodiment of the present disclosure. The method includes:

Step 101: doping a magnetic material in filling adhesive to form a mixed adhesive.

In this embodiment, the filling adhesive is an adhesive commonly used in packaging of an OLED display panel, and filled between a first substrate and a second substrate. It can be Ultraviolet (UV) adhesive, i.e., an adhesive cured by UV to be used in a later stage; it may also be other adhesives, which will not be specifically limited in the embodiment of the present disclosure. A magnetic material C is doped in a filling adhesive 300 to form a mixed adhesive 301. For example, the filling adhesive and the magnetic material are mixed in a filling machine; and the filling adhesive and the magnetic material that are mixed are stirred in a defoaming machine, so that the magnetic material is uniformly distributed in the filling adhesive, to form the mixed adhesive 301. For example, the magnetic material is a transparent magnetic material. The magnetic material is, for example, granular.

Step 102: fixing the first substrate onto a carrying platform.

Figure 2:
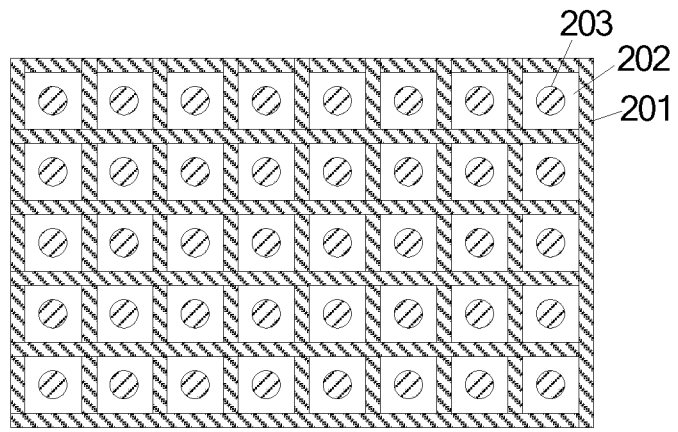
FIG. 2 shows a structural schematic diagram of an electromagnetic system according to the embodiment of the present disclosure.

In this embodiment, the first substrate can be fixed onto the carrying platform by vacuum adsorption, and the first substrate can also be fixed onto the carrying platform in other manners, which will not be specifically limited in the embodiment of the present disclosure. For example, the carrying platform 201 can be a component in an electromagnetic system, and the electromagnetic system may further include a plurality of electromagnetic units 202 uniformly distributed on the carrying platform 201, and vacuum adsorption pores 203, with reference to the electromagnetic system shown in FIG. 2. The carrying platform 201 can be a glass carrying platform, which will not be specifically limited in the embodiment of the present disclosure. The electromagnetic unit 202 can generate an electromagnetic field after being energized, and the electromagnetic field controls intensity, direction and the like of the electromagnetic field through a structure in the electromagnetic unit 202.

For example, the first substrate can be a glass plate or a package cover plate on which an electroluminescent element is formed.

Step 103: dispensing the mixed adhesive on a surface of the first substrate to form a first adhesive layer having a first pattern.

Figure 3:
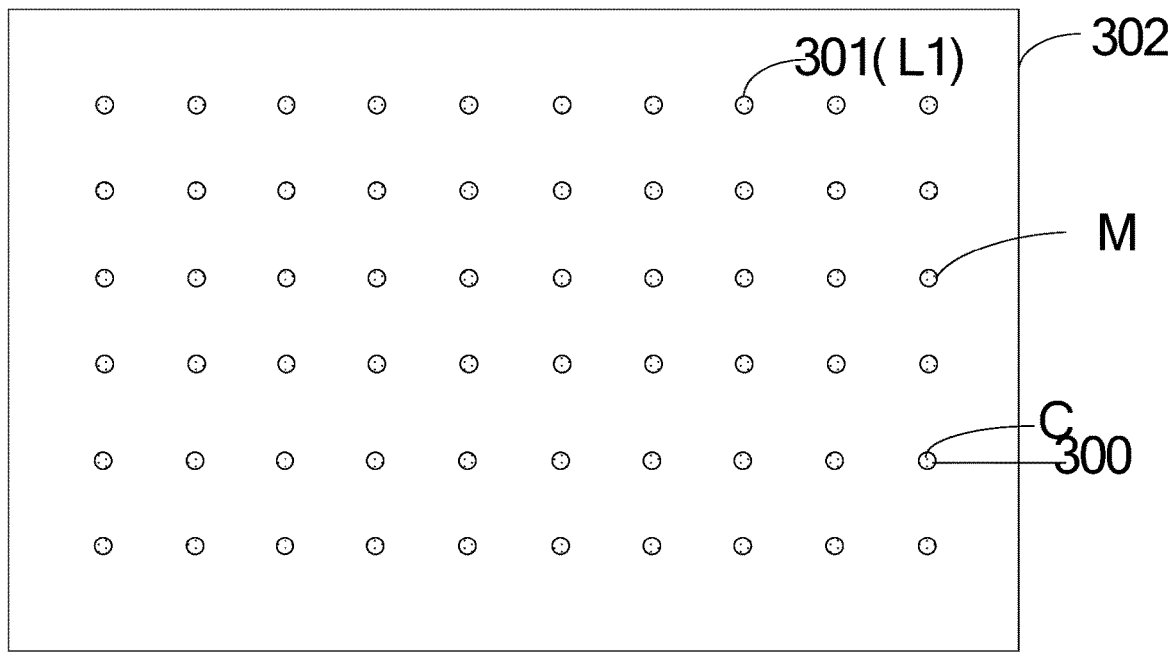
FIG. 3 shows a schematic diagram of forming a first adhesive layer having a first pattern on a first substrate according to the embodiment of the present disclosure.

In this embodiment, after the first substrate 302 is fixed onto the carrying platform 201, the mixed adhesive 301 is dispensed on the surface of the first substrate 302, to form a first adhesive layer L1 having a first pattern on the first substrate 302, as shown in FIG. 3. The first adhesive layer L1 having the first pattern includes a plurality of separated portions M, for example, a distance between each adjacent two separated portions M on the surface of the first substrate is 8 mm to 12 mm, and a mass of each of the separated portions M is 0.5 mg to 1.0 mg.

Step 104: forming an electromagnetic field on a surface of the carrying platform, so that the magnetic material is diffused under an action of the electromagnetic field, and the mixed adhesive is uniformly distributed on the surface of the first substrate along with diffusion of the magnetic material, so as to form a second adhesive layer having a second pattern.

In this embodiment, the electromagnetic system can be turned on, so that respective electromagnetic units 202 of the electromagnetic system form an electromagnetic field on the surface of the carrying platform 201. The magnetic material in the mixed adhesive 301 is diffused under the action of the electromagnetic field, and the respective separated portions M of the first adhesive layer L1 of the mixed adhesive 301 are diffused to the periphery with diffusion of the magnetic material, with reference to an arrow direction shown in FIG. 4. The respective separated portions of the first adhesive layer L1 are diffused to the periphery, and finally, the mixed adhesive 301 is uniformly distributed on the surface of the first substrate 302 to form a second adhesive layer L2 having a second pattern of the mixed adhesive, with reference to a schematic diagram of uniform distribution of the mixed adhesive shown in FIG. 5. The second adhesive layer L2 having the second pattern is continuous.

Figure 4:
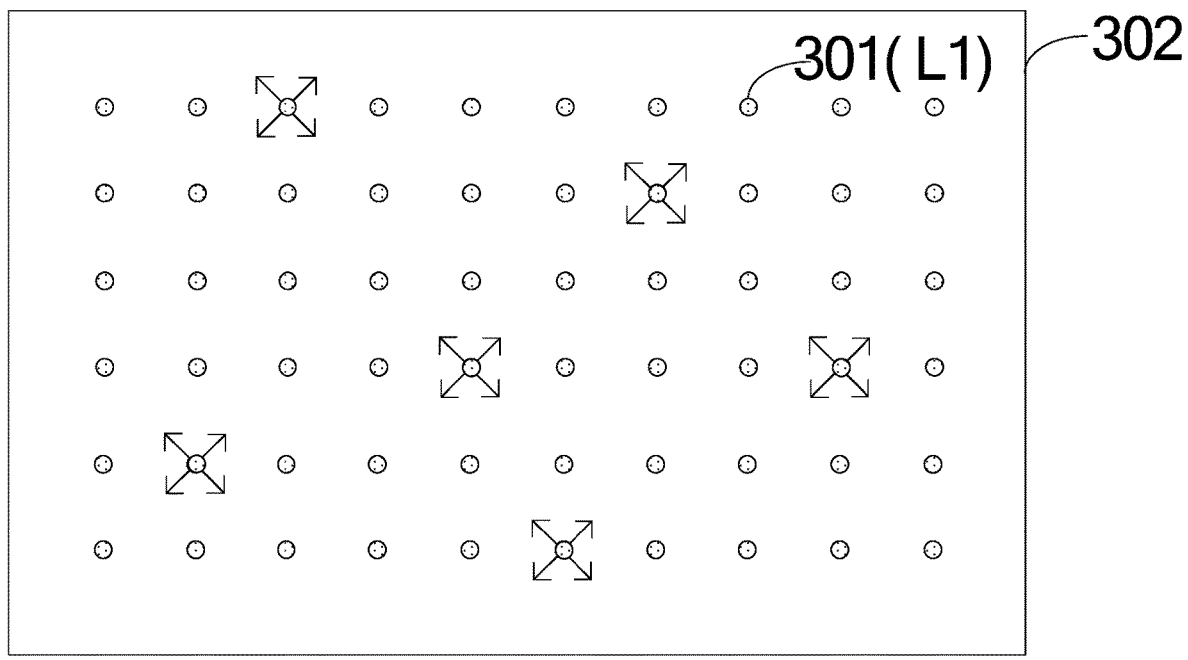
FIG. 4 shows a schematic diagram of diffusion of the first adhesive layer according to the embodiment of the present disclosure.
Figure 5:
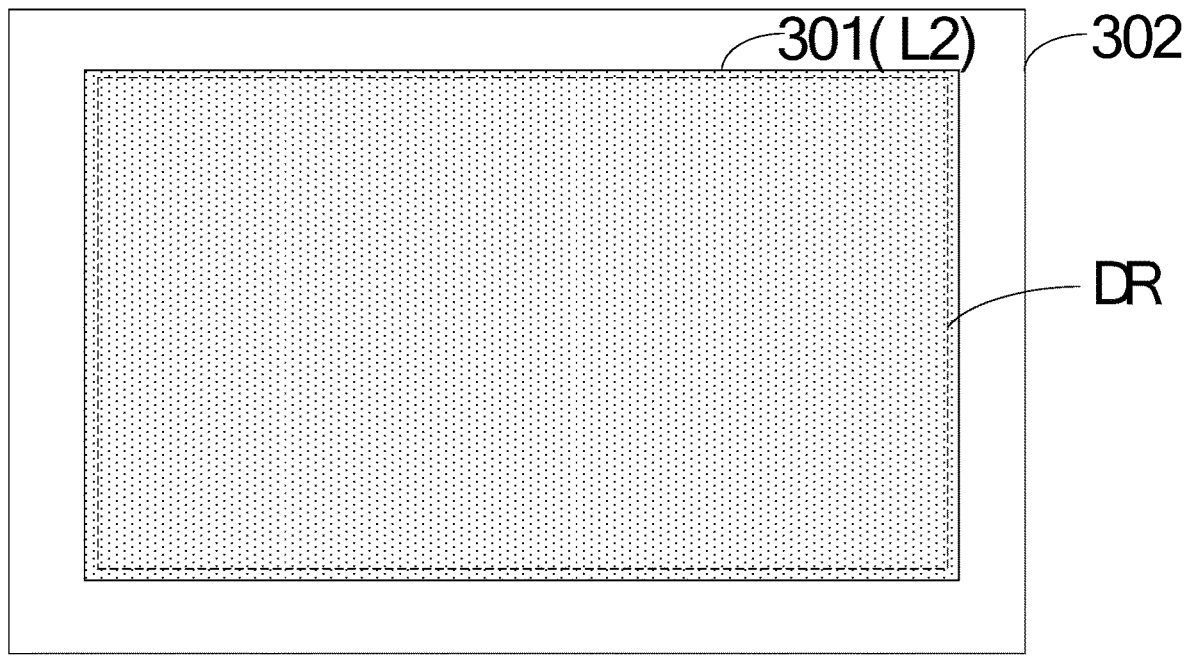
FIG. 5 shows a schematic diagram of forming a second adhesive layer having a second pattern on the first substrate according to the embodiment of the present disclosure.

With reference to FIG. 3 to FIG. 5, an orthogonal projection of the first adhesive layer L1 having the first pattern on the first substrate 302 is smaller than an orthogonal projection of the second adhesive layer L2 having the second pattern on the first substrate 302.

The display panel has a display region DR. With reference to FIG. 5, the orthogonal projection of the second adhesive layer L2 having the second pattern on the first substrate 302 completely covers an orthogonal projection of the display region DR (as shown by a dotted-line box) on the first substrate 302. In another embodiment, an orthogonal projection of the second adhesive layer L2 having the second pattern on the first substrate 302 can partially overlap with an orthogonal projection of the display region DR on the first substrate 302.

In the embodiment of the present disclosure, an intensity of the electromagnetic field can be adjusted by current of the electromagnetic unit 202. For example, the thickness deviation of the second adhesive layer L2 of the mixed adhesive having the second pattern≤0.5%

Step 105: pressing and bonding the second substrate on the second adhesive layer having the second pattern.

In this embodiment, after the mixed adhesive 301 is uniformly distributed on the surface of the first substrate 302, the second substrate 303 and the first substrate 302 can be pressed and bonded together with a Vacuum Align System (VAS).

In summary, in the embodiment of the present disclosure, the magnetic material is doped in the filling adhesive to form the mixed adhesive; the first substrate is fixed onto the carrying platform; the mixed adhesive is dispensed on the surface of the first substrate; the electromagnetic field is formed on the surface of the carrying platform; the magnetic material is diffused under the action of the electromagnetic field, the mixed adhesive is uniformly distributed on the surface of the first substrate along with the diffusion of the magnetic material; and finally, the second substrate is pressed and bonded on the mixed adhesive. In the embodiment of the present disclosure, it is only necessary to consider a total dripping quantity of the mixed adhesive, without taking into account the dripping precision, and meanwhile, it is not necessary to align, but only necessary to drip the mixed adhesive onto the first substrate; since uniform distribution of the mixed adhesive is implemented before pressing and bonding, a gap between the first substrate and the second substrate after pressing and bonding is more uniform, which avoids occurrence of the phenomenon of uneven display, improves a packaging effect, and simplifies processing adjustment.

Figure 6:
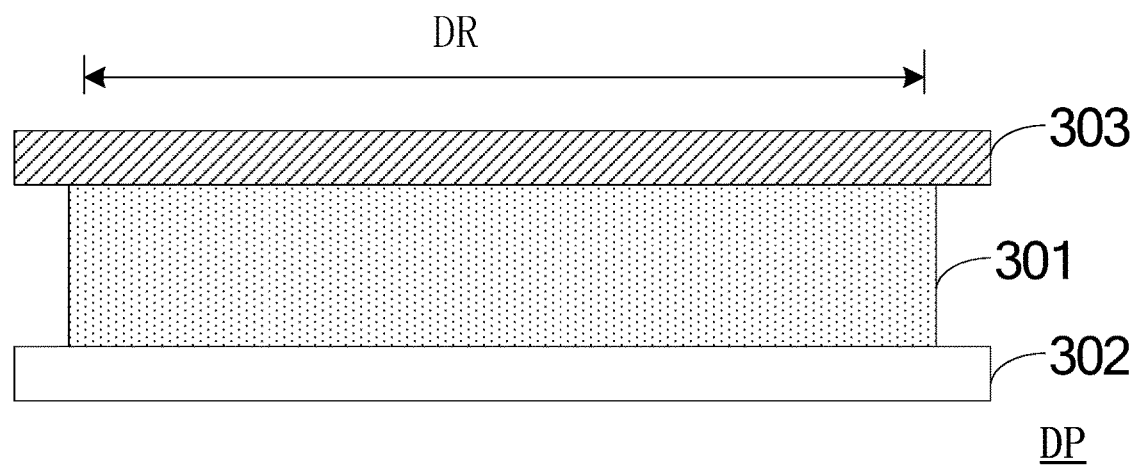
FIG. 6 is a structural schematic diagram of a display panel according to an embodiment of the present disclosure.
Figure 7:
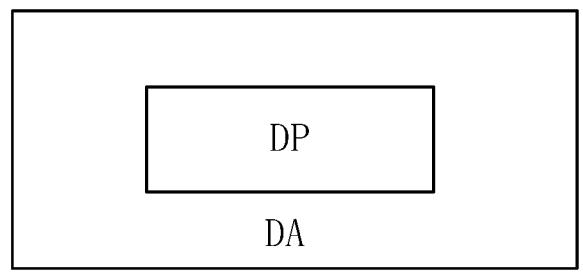
FIG. 7 shows a schematic diagram of a display device according to an embodiment of the present disclosure.

With reference to FIG. 6, a display panel DP provided by an embodiment of the present disclosure is shown. The display panel is packaged by using the method as described in the above described embodiment, and the display panel includes a first substrate 302, a second substrate 303, and a layer of mixed adhesive 301 uniformly distributed between the first substrate 302 and the second substrate 303;

Wherein, the mixed adhesive 301 is a mixture of a filling adhesive and a magnetic material.

In this embodiment, the display panel is packaged by using the method as described in the above embodiment, and therefore, the mixed adhesive 301 filled between the first substrate 302 and the second substrate 303 is a mixture of the filling adhesive and the magnetic material. The magnetic material can be diffused under an action of the electromagnetic field, so that the mixed adhesive 301 is uniformly distributed on the first substrate 302.

For example, the display panel is an OLED display panel.

For example, the magnetic material is nano $\gamma\text{-}Fe_2O_3$.

For example, a distance between the first substrate and the second substrate is 5 μm to 6 μm.

In summary, in the embodiment of the present disclosure, the display panel includes the first substrate, the second substrate and the mixed adhesive uniformly distributed between the first substrate and the second substrate, and the mixed adhesive is a mixture of the filling adhesive and the magnetic material. Since uniform distribution of the mixed adhesive is implemented before pressing and bonding the first substrate and the second substrate, a gap between the first substrate and the second substrate after press-fitting is more uniform, which avoids occurrence of the phenomenon of uneven display, improves a packaging effect, and simplifies processing adjustment.

An embodiment of the present disclosure provides a display device DA. The display device includes the display panel DP provided by the above-described embodiment.

In this embodiment, the display device includes the display panel according to the above mentioned embodiment, the display panel includes a first substrate 302, a second substrate 303, and mixed adhesive 301 uniformly distributed between the first substrate 302 and the second substrate 303; wherein, the mixed adhesive 301 is a mixture of a filling adhesive and a magnetic material.

In summary, in the embodiment of the present disclosure, the display device includes the display panel, the display panel includes the first substrate, the second substrate and the mixed adhesive uniformly distributed between the first substrate and the second substrate, and the mixed adhesive is a mixture of the filling adhesive and the magnetic material. Since uniform distribution of the mixed adhesive is implemented before pressing and bonding the first substrate and the second substrate, a gap between the first substrate and the second substrate after press-fitting is more uniform, which avoids occurrence of the phenomenon of uneven display, improves a packaging effect, and simplifies processing adjustment.

Various embodiments in the present specification are described in a progressive manner, differences of each embodiment from the other embodiments are emphatically illustrated, and for the identical or the similar parts among respective embodiments, the embodiments can be referred to mutually.

Finally, it should also be noted that in this specification, terms like "first" and "second" are only used to differentiate one entity or operation from another, but are not necessarily used to indicate any practical relationship or order between these entities or operations. Moreover, terms such as "include", "comprise" or any variation of the terms mean "including but not limited to". Therefore, a process, method, object, or device that includes a series of elements not only includes these elements, but also includes other elements that are not specified expressly, or may further include inherent elements of the process, method, object or device. In the case that there are no more limitations, in the context of an element that is defined by "includes one . . . ", the process, method, object or device that includes the element may include other identical elements.

The packaging method of the display panel, the display panel, and the display device provided by the embodiments of the present disclosure are described in detail above; specific examples are used in this specification for expounding the principles and the implementation modes of the embodiments of the present disclosure, and the above description of the embodiments is only used for helping understand the method according to the embodiments of the present disclosure and its core idea; meanwhile, those ordinarily skilled in the art will make changes in the specific implementation modes and the application scope, according to the idea of the embodiments of the present disclosure. In summary, the contents of this specification should not be construed as limiting the embodiments of the present disclosure.

The invention claimed is:

1. A packaging method of a display panel, comprising:
providing a first substrate;
providing an adhesive with a magnetic material distributed therein;
applying the adhesive to a surface of the first substrate to form a first adhesive layer having a first pattern;
providing a magnetic field to drive the magnetic material to mobilize the adhesive on the surface of the first substrate, so as to transform the first adhesive layer having the first pattern into a second adhesive layer having a second pattern, wherein, an orthogonal projection of the first adhesive layer having the first pattern on the first substrate is different from an orthogonal projection of the second adhesive layer having the second pattern on the first substrate; and
bonding a second substrate onto the adhesive layer having the second pattern,
wherein the first adhesive layer having the first pattern includes a plurality of separated portions.

2. The method according to claim 1, wherein, an orthogonal projection of the first adhesive layer having the first pattern on the first substrate is smaller than an orthogonal projection of the second adhesive layer having the second pattern on the first substrate.

3. The method according to claim 1, wherein, the display panel has a display region, and an orthogonal projection of the second adhesive layer having the second pattern on the first substrate at least partially overlaps with an orthogonal projection of the display region on the first substrate.

4. The method according to claim 1, wherein, the providing a first substrate includes providing the first substrate to a carrying platform, and the carrying platform is configured to provide the magnetic field.

5. The method according to claim 1, wherein, the second adhesive layer having the second pattern is continuous.

6. The method according to claim 1, wherein, the first substrate includes a glass plate or a package cover plate on which an electroluminescent element is formed.

7. The method according to claim 1, wherein, the magnetic material is transparent.

8. The method according to claim 1, wherein, as to the first adhesive layer having the first pattern, a distance between each adjacent two separated portions is in a range of 8 mm to 12 mm, and a mass of each of the separated portions is in a range of 0.5 mg to 1.0 mg.

9. A packaging method of a display panel, comprising:
providing a first substrate;
providing an adhesive with a magnetic material distributed therein;
applying the adhesive to a surface of the first substrate to form a first adhesive layer having a first pattern;
providing a magnetic field to drive the magnetic material to mobilize the adhesive on the surface of the first substrate, so as to transform the first adhesive layer having the first pattern into a second adhesive layer having a second pattern, wherein, an orthogonal projection of the first adhesive layer having the first pattern on the first substrate is different from an orthogonal projection of the second adhesive layer having the second pattern on the first substrate; and
bonding a second substrate onto the adhesive layer having the second pattern,
wherein the first adhesive layer having the first pattern includes a plurality of separated portions,
wherein, the providing an adhesive doped with a magnetic material includes:
mixing the adhesive and the magnetic material in a filling machine;
stirring the adhesive and the magnetic material mixed in a defoaming machine, so that the magnetic material is uniformly distributed in the filling adhesive.

10. The method according to claim 9, wherein orthogonal projection of the first adhesive layer having the first pattern on the first substrate is smaller than an orthogonal projection of the second adhesive layer having the second pattern on the first substrate.

11. The method according to claim 9, wherein the display panel has a display region, and an orthogonal projection of the second adhesive layer having the second pattern on the first substrate at least partially overlaps with an orthogonal projection of the display region on the first substrate.

12. The method according to claim 9, wherein the providing a first substrate includes providing the first substrate to a carrying platform, and the carrying platform is configured to provide the magnetic field.

13. The method according to claim 9, wherein the first substrate includes a glass plate or a package cover plate on which an electroluminescent element is formed.

* * * * *